US006621732B2

(12) United States Patent
Allenspach et al.

(10) Patent No.: US 6,621,732 B2
(45) Date of Patent: Sep. 16, 2003

(54) MAGNETIC ELEMENT, MEMORY DEVICE AND WRITE HEAD

(75) Inventors: Rolf Allenspach, Adliswil (SE); Johannes G Georg Bednorz, Wolfhausen (SE); Ingmar Meijer, Zurich (SE)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/972,286

(22) Filed: Oct. 5, 2001

(65) Prior Publication Data

US 2002/0048186 A1 Apr. 25, 2002

(30) Foreign Application Priority Data

Oct. 17, 2000 (EP) .............................................. 00810955

(51) Int. Cl.[7] .......................... G11C 11/15; G11C 11/00; G11C 15/02; G11C 19/00; G11C 19/08
(52) U.S. Cl. ......................... 365/173; 365/158; 365/50; 365/83; 365/26
(58) Field of Search ............................ 365/173, 50, 83, 365/26, 158

(56) References Cited

U.S. PATENT DOCUMENTS

| 5,841,692 | A | * | 11/1998 | Gallagher et al. | ........... 365/173 |
|---|---|---|---|---|---|
| 5,959,880 | A | * | 9/1999 | Shi et al. | ..................... 365/158 |
| 5,966,323 | A | * | 10/1999 | Chen et al. | .................. 365/158 |
| 6,127,045 | A | * | 10/2000 | Gill | ............................. 427/131 |
| 6,153,320 | A | * | 11/2000 | Parkin | ........................ 427/131 |
| 6,178,112 | B1 | * | 1/2001 | Bessho et al. | .............. 365/171 |
| 6,211,559 | B1 | * | 4/2001 | Zhu et al. | .................... 257/421 |
| 6,365,286 | B1 | * | 4/2002 | Inomata et al. | ........ 360/114.01 |

FOREIGN PATENT DOCUMENTS

| JP | 62132222 | * | 6/1987 | ............ G11B/5/66 |
| SE | WO 95 22820 |  | 8/1995 | ............ G11B/5/09 |
| SE | WO 98 25263 |  | 6/1998 | ........... G11B/5/127 |

* cited by examiner

Primary Examiner—Steven Loke
Assistant Examiner—Samuel A Gebremariam
(74) Attorney, Agent, or Firm—Ron Feece; William D. Gill

(57) ABSTRACT

A ferromagnetic pinned layer (1) kept at a fixed magnetic orientation by a pinning layer (4) is separated from a ferromagnetic free layer (3) by a Mott insulator coupling layer (2). A controllable voltage source (5) is connected between the pinned layer (1) and the free layer (3). A sublayer of the coupling layer (2) whose width (d) increases with the voltage is converted to an electrically conducting and magnetically coupling metallic state. The magnetic exchange field acting on the free layer (3) which is controlled by the applied voltage via the width (d) of the electrically conducting sublayer of the coupling layer (2) can be used to switch the free layer (3) between states of parallel and antiparallel orientations with respect to the magnetic orientation of the pinned layer (1). This is used in memory cells and in a write head.

13 Claims, 5 Drawing Sheets

MAGNETIC ELEMENT, MEMORY DEVICE AND WRITE HEAD

FIELD OF THE INVENTION

The invention relates to a magnetic element for use in a magnetic memory device. Elements of this type can be used as a switch and for other purposes, particularly in electronic devices for data processing and related uses. The invention also relates in particular to a memory device and a write head using one or more of the magnetic elements in question.

PRIOR ART

It is well known that a thin layer of ferromagnetic material can assume two different magnetic orientations, thereby forming a magnetic element switchable between two different states. This effect is used, e.g., in magnetic storage or magnetic memories. However, switching, i.e., reorientation of the magnetization in such a layer requires the application of a magnetic field, usually created by relatively strong currents. This makes conventional elements rather difficult to control. Moreover, the currents tend to cause thermal problems and high power consumption, related effects which are both disadvantageous.

SUMMARY OF THE INVENTION

The invention as characterised in claim 1 provides a magnetic element which can be controlled by an electric field. As electric fields are much easier to build up and control and less subject to inertia effects than magnetic fields the element according to the invention can be controlled much easier than a conventional element. Design is also simplified by the fact that the element is driven by voltage rather than current. This makes smaller element sizes feasible and allows higher densities. Used as a memory cell the magnetic element according to the invention offers possibilities for densities not achievable with conventional magnetic elements.

This advantageously provides a magnetic element switchable between two different states which is easier to control than conventional elements.

BRIEF DESCRIPTION OF THE DRAWINGS

Preferred embodiments of the invention will now be described, by way of example only, with reference to the accompanying figures, in which.

DESCRIPTION OF THE PREFERRED EMBODIMENTS

Figure 1:
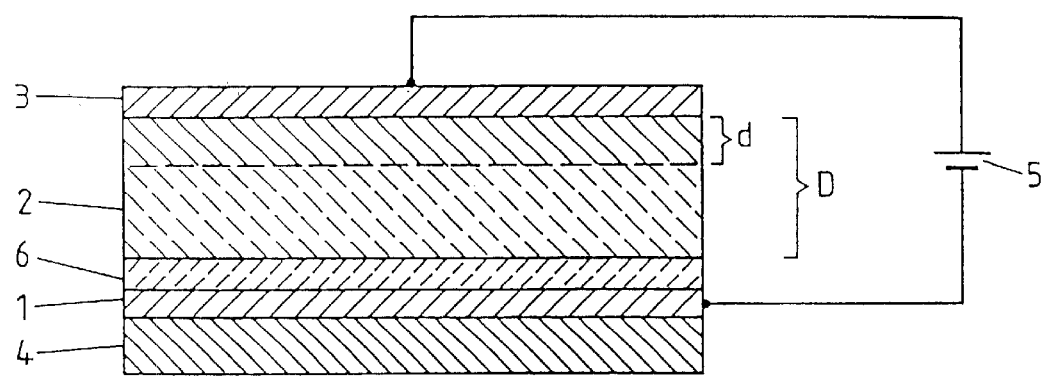
FIG. 1 shows schematically a section of a magnetic element according to a first embodiment of the invention.

In a first embodiment of the invention (FIG. 1) the magnetic element comprises a second layer, pinned layer 1 consisting of an electrically conducting ferromagnetic or ferrimagnetic material, an adjacent third layer, coupling layer 2 of thickness D and further a first layer, free layer 3 again consisting of an electrically conducting ferromagnetic or ferrimagnetic material. The material of coupling layer 2 can be switched between an electrically insulating and magnetically non-coupling state and electrically conducting and magnetically coupling metallic states by the application of an electric field. The magnetic orientation of the pinned layer 1 is pinned to a fixed direction by a pinning layer 4 adjacent to the pinned layer 1 opposite the coupling layer 2. The pinning layer 4 is either a permanent magnet having a coercive field larger than any ambient magnetic field it may foreseeably be exposed to, or an antiferromagnet. There is further a controllable voltage source 5 connected between the free layer 3 and the pinned layer 1. As the resistivity of the coupling layer 2 material is usually fairly small, an insulating layer 6 is arranged between the pinned layer 1 connected to the negative terminal of the voltage source 5 and the coupling layer 2 in order to limit the current between the electrodes. On the other hand, the positive terminal of the voltage source 5 is electrically conductively connected to the coupling layer 2.

Figure 2:
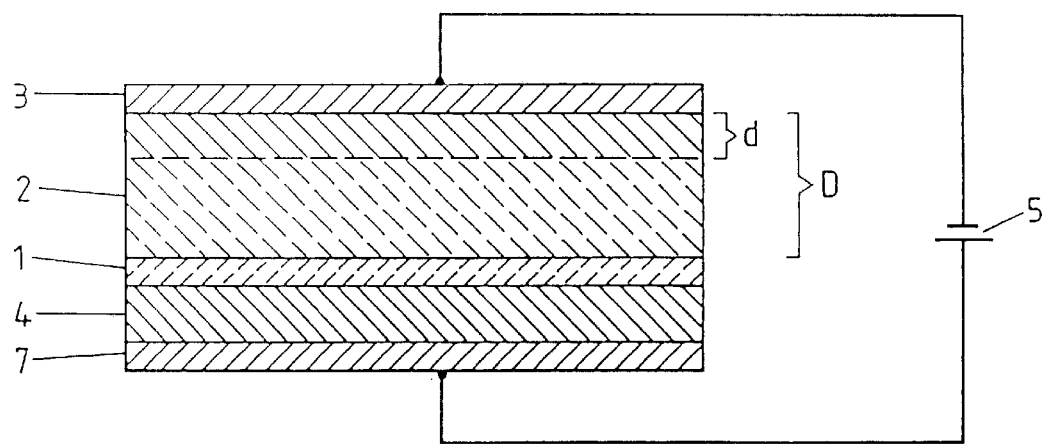
FIG. 2 shows schematically a section of a magnetic element according to a second embodiment of the invention.

In a second embodiment (FIG. 2) of the invention a separate electrode layer 7 connected to the positive terminal of the controllable voltage source 5 is arranged following pinning layer 4 opposite pinned layer 1 and coupling layer 2. The negative terminal of the controllable voltage source 5 is connected to free layer 3. Pinned layer 1 consists of an electrically insulating ferromagnetic material and serves at the same time as an insulating layer. Other combinations of electrically conducting or insulating pinned layers or free layers and supplemental insulating, electrode or pinning layers where necessary are of course also possible.

Many choices of material are possible for the pinned layer 1, the coupling layer 2 and the free layer 3. The pinned layer 1 consists of a ferromagnetic or ferrimagnetic material, preferably a perovskite or related compound, in particular an ordered double perovskite $A_2B'B''O_6$ where A is an alkaline earth element, $B'$ is Fe or Cr and $B''$ is Mo, W or Re or a perovskite $R_{1-x}A_xMnO_3$ with $0 \leq x \leq 1$ where R is a rare earth element and A an alkaline earth element or $Fe_4N$. The free layer 3 usually consists of a ferromagnetic or ferrimagnetic material as well, preferably of the above-mentioned materials. Other possibilities for the free layer 3 include transition metals or rare earth elements like Fe, Co, Ni Gd, Y, Th as well as combinations thereof and with all of the above. For the coupling layer 2 a Mott insulator is used. Possible materials comprise perovskites or related compounds, in particular transition metal perovskites such as $R_{1-x}A_xNiO_3$, $R_{1-x}A_xCoO_3$, $R_{1-x}A_xFeO_3$, $R_{1-x}A_xMnO_3$, $R_{1-x}A_xCrO_3$, $R_{1-x}A_xVO_3$, $R_{1-x}A_xTiO_3$, with $0 \leq x \leq 1$ where R is a rare earth element and A an alkaline earth element or related materials such as $Y_{1-x}Pr_xBa_2Cu_3O_{7\delta}$ with $0 \leq x \leq 1$ or a mixture of the said materials. For the electrode layer 7 (FIG. 2) and the insulating layer 6 (FIG. 1), e.g., SrRuO$_3$ and Ba$_{1-x}$Sr$_x$TiO$_3$ with $0 \leq x \leq 1$ can be used, respectively.

As the thickness D of the coupling layer 2 is very small—of the order of several nanometers—and at the same time crucial for the function of the magnetic element, great care must be taken to ensure that the said thickness is precisely controlled and constant. Consequently, the surfaces of the layers should be extremely smooth. Using known techniques like sputtering, pulsed laser deposition, molecular beam epitaxy or chemical vapour deposition layers having the required properties can be produced. In order to avoid irregularities of the lattice structure it is preferable that the layers consist of structurally similar materials.

Figure 3:
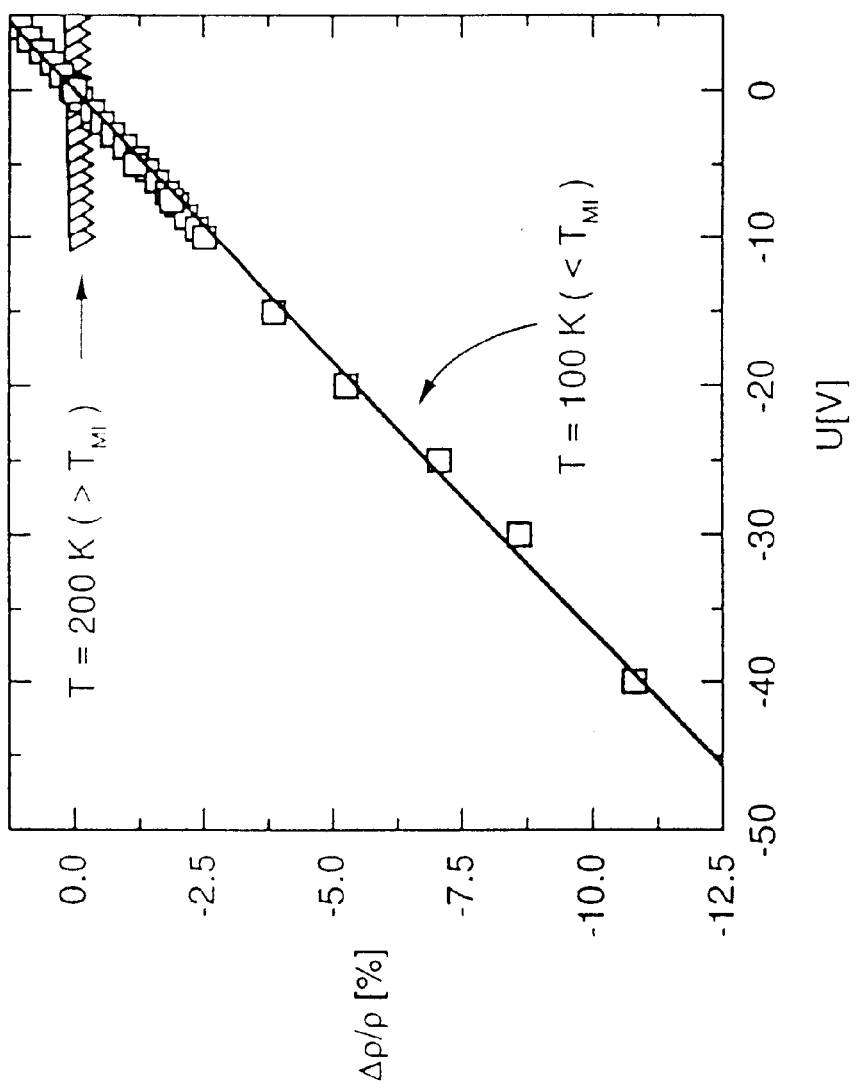
FIG. 3 shows the relative change of resistivity in a coupling layer material as a function of the voltage applied at temperatures of 100 K (high impedance state) and 200 K (low impedance state)

The effect of the electrical field on a coupling layer was demonstrated as shown in FIG. 3. A controllable voltage source was connected between the coupling layer and a PtAu electrode layer. These two layers were separate by a 100 nm thick amorphous TaO insulating layer. The resistance of the coupling layer was measured with a 4 point resistance measuring circuit.

For the coupling layer a member of the RNiO$_3$ series, where R is a rare earth element like Pr, Nd, Sm was used. These compounds are known to be on the verge of the insulator-to-metal transition. For example, a small change of the temperature, pressure, or tolerance factor (chemical pressure) can drive this transition (see, for example, M. Imada, A. Fujimori, and Y. Tokura, Rev. Mod. Phys. 70, 1039 (1998), and references cited therein). The insulator-to-metal transition temperature in this series of Mott insulators can be tuned between $T_{MI}=0$ K for LaNiO$_3$ and $T_{MI}=600$ K for LuNiO$_3$. For room temperature applications one could choose for R a mixture of the elements Nd and Sm. In the experiment the results of which are shown in FIG. 3 the coupling layer consisted of an epitaxial 100 Å thin film of NdNiO$_3$ that has a sharp insulator-to-metal transition at $T_{MI}$ 200 K.

As soon as a negative gate voltage U is applied, hole-like carriers migrate into the NdNiO$_3$ layer which causes a decrease of the resistivity. If NdNiO$_3$ is in its high impedance state, the resistivity, which, at T=100 K, is of the order of 0.1€Ωcm, can be reduced by up to about 10%. The electric field effect is negligibly small at T≧€200 K when the layer is in its metallic state with resistivity p€10$^4$ Ωcm. Larger electric field effects are expected for thinner coupling layers and insulating layers and insulating layer materials with a higher dielectric constant, e.g., Ba$_{1-x}$Sr$_x$TiO$_3$.

The gate voltage can be positive as well as negative, with electrons in stead of holes serving as charge carriers. What is more appropriate depends mainly on the coupling layer material. For most coupling layer materials the application of an electric field has the following effect: With no voltage applied, the coupling layer 2 of thickness D (FIG. 1, 2) is entirely in an electrically insulating and magnetically non-coupling state. As soon as a voltage is applied by the voltage source 5, a sublayer of the coupling layer 2 adjacent to the free layer 3 is switched to an electrically conducting and magnetically coupling metallic state as charge carriers migrate into the coupling layer 2 from the free layer 3. The width d of the metallic sublayer increases with the voltage. In the insulating sublayer whose width is Dd the magnetic exchange field H$_{ex}$ caused by pinned layer 1 decays exponentially, i.e.

$$H_{ex}^{(1)}(x) = H_0 e^{-\alpha x}, \quad 0 \leq x \leq D-d \quad (1)$$

where H$_0$ is the magnetic field at the boundary of the coupling layer 2 facing pinned layer 1 and x is the distance from said boundary (s.e.g. P. Bruno, Phys. Rev. B 49, 13231 (1994)). In the adjacent metallic sublayer, however, the magnetic field Hex follows a damped oscillation curve of the type $$H_{ex}^{(2)}(x') = H_{ex}^{(1)}(D-d) \times A/x'^2 \times \sin((2\pi x'/\lambda) + \Phi), \quad 0 < x' \leq d \quad (2)$$

where $H_{ex}^{(1)}(D-d) = H_0 e^{\alpha(D-d)}$ is the magnetic exchange field at the boundary between the insulating sublayer and the metallic sublayer of coupling layer 2 and x' is the distance from the said boundary, i.e. x'=x(Dd). The oscillation period λ depends exclusively on the material of coupling layer 2, in particular its Fermi wavelength, whereas amplitude A and phase shift Φ also depend on the materials of pinned layer 1 and free layer 3 (s. e g. J. Mathon, J. Magn. Mater. 100, 527 (1991) and R. Allenspach and W. Weber, IBM J. Res. Develop. 42, 7 (1998)). Close to x'=0 the dependence of the magnetic exchange field deviates from (2) in such a way that $H_{ex}^{(2)}$ approaches $H_{ex}^{(1)}(D-d)$. The free layer 3 is exposed to a magnetic exchange field $$H_{ex}^{D}(d) = H_{ex}^{(2)}(d) = H_{ex}^{(1)}(D-d) \times A/d^2 \times \sin((2\pi d/\lambda) + \Phi), 0 < d \leq D \quad (3)$$

Figure 4:
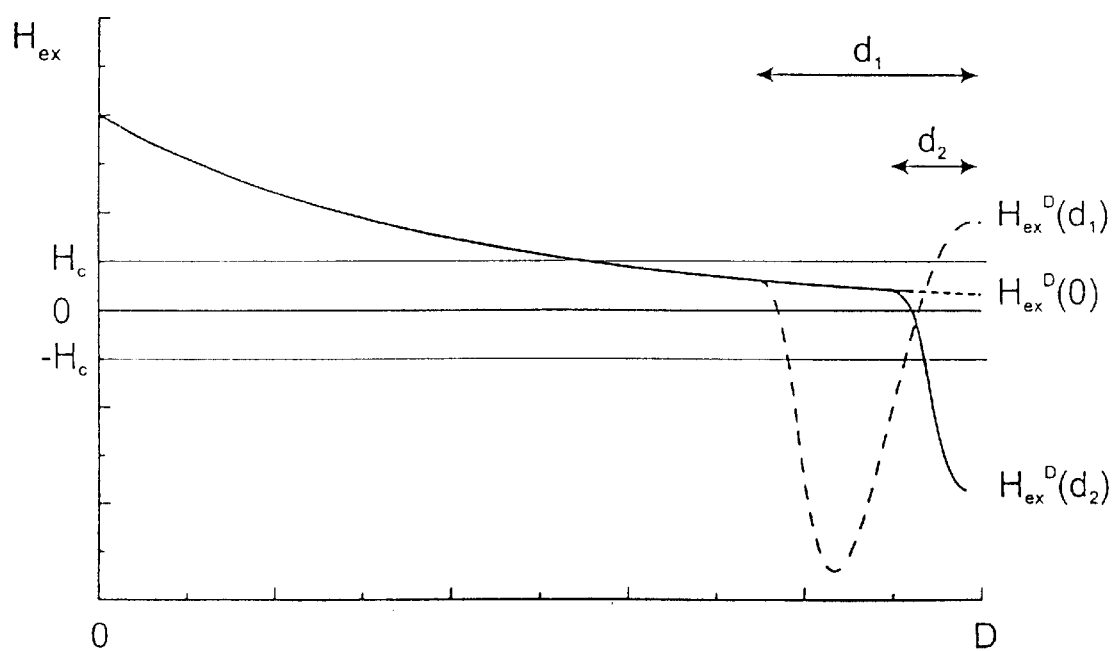
FIG. 4 shows the magnetic exchange field in the coupling layer for different widths of the electrically conducting sublayer.

$H_{ex}^{D}$ essentially follows a damped oscillation curve as a function of d and there are alternating intervals of positive and negative $H_{ex}^{D}$. If the maximum and the minimum of $H_{ex}^{D}$ are both larger than the coercive field H$_c$ of the free layer 3, the magnetic orientation of the free layer 3 can be arbitrarily controlled by appropriately controlling the width d via the applied voltage. The principle is illustrated in FIG. 4 where for d=d$_1$ the magnetic exchange field H$_{ex}$ takes on a value $H_{ex}^{D}(d_1) > 0$ at the boundary between coupling layer 2 and free layer 3 (dashed line) causing ferromagnetic coupling between pinned layer 1 and free layer 3 whereas for d=d$_2$ the corresponding value is $H_{ex}^{D}(d_2) < 0$ (solid line), the coupling being antiferromagnetic.

Figure 5:
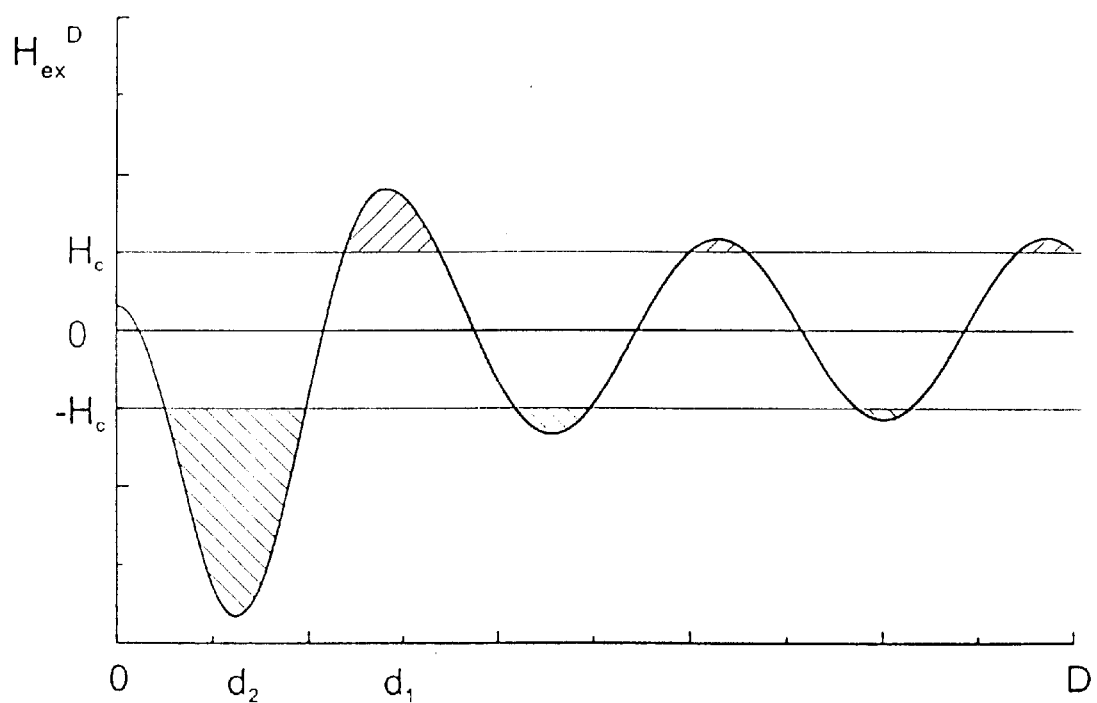
FIG. 5 shows the magnetic exchange field at the boundary of the switching layer as a function of the width of the electrically conducting sublayer.

The dependence of the magnetic exchange field acting on the free layer 3 on the width d and consequently on the voltage is more readily apparent from FIG. 5. The magnetic exchange field $H_{ex}^{D}$ can be made larger than the positive coercive field +H$_c$ or smaller than the negative coercive filed H$_c$ or it can be kept between H$_c$ and +H$_c$. As soon as H surpasses +H$_c$ the free layer 3 assumes an orientation parallel to that of pinned layer 1 which it retains until $H_{ex}^{D}$ drops below H$_c$ when it flips to an antiparallel orientation. If, as in the example given in FIGS. 4, 5 the coercive field H$_c$ is larger than the magnetic exchange field $H_{ex}^{D}(0) = H_0 e^{\alpha D}$ (dotted line in FIG. 4) the free layer 3 is exposed to at zero voltage, the latter retains, when the voltage is switched off, the magnetic orientation corresponding to the sign last assumed by $H_{ex}^{D}(d)$ with $|H_{ex}^{D}(d)| > H_c$ as d approaches zero. In the case illustrated by FIGS. 4, 5 the alignment of free layer 3 is antiparallel with respect to pinned layer 1 at zero voltage.

The electric field effect can follow a somewhat different mechanism if the coupling layer, e.g., for a particular doping x in one of the coupling layer materials mentioned above, is in a semiconducting or metallic state even without an electric field being applied. In this case the magnetic exchange field follows a damped oscillation curve essentially according to equation (2)—with $H_{ex}^{(1)}(D-d)$ replaced by H$_0$—above. The electric field influences the carrier density throughout the coupling layer which in turn affects the Fermi wavelength and consequently the wavelength of the oscillation. The technically relevant effect—that the magnetic exchange field $H_{ex}^{D}$ the free layer is exposed to can be controlled via the applied voltage—is the same.

Figure 6:
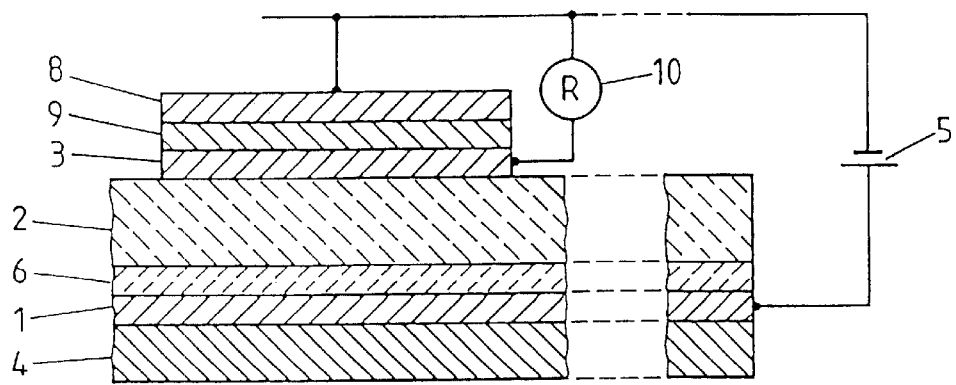
FIG. 6 shows schematically a partial section of a first memory device according to the invention comprising an array of memory cells constituted as magnetic elements.

In any case the electric field effect can be used in a memory cell or a memory device comprising an array of such memory cells as shown in FIG. 6 where the pinning layer 4, the pinned layer 1, the insulating layer 6 and the coupling layer 2 continuously cover a relatively large area whereas the free layer 3 is divided into small separate patches (only one of which is shown in the figure) completing individual memory cells. For each cell, a connecting layer 8 consisting of a ferromagnetic material of fixed magnetic orientation and spaced from the free layer 3 by a metallic spacer layer 9 is provided opposite the coupling layer 2. The voltage source 5 is connected between the pinned layer 1 and the connecting layer 8. Furthermore, a resistance measuring circuit 10 is connected between the free layer 3 and the connecting layer 8. The memory cell can be written to by switching the magnetic orientation of the patch of free layer 3 to a state parallel or antiparallel with respect to the fixed orientation of the pinned layer 1 applying an appropriate voltage as explained above. For reading the memory cell the electrical resistance of the stack consisting of free layer 3, spacer layer 9 and connecting layer 8 is measured which depends on the magnetic orientations of the free layer 3 and the connecting layer 8 being parallel or antiparallel and is known in the art as giant magnetoresistance. As the free layer 3 will always assume a fixed—usually antiparallel—magnetic orientation with respect to that of pinning layer 1 as soon as the voltage is switched off, the stored information is destroyed in that case, i.e., the memory elements are of the volatile type.

Figure 7:
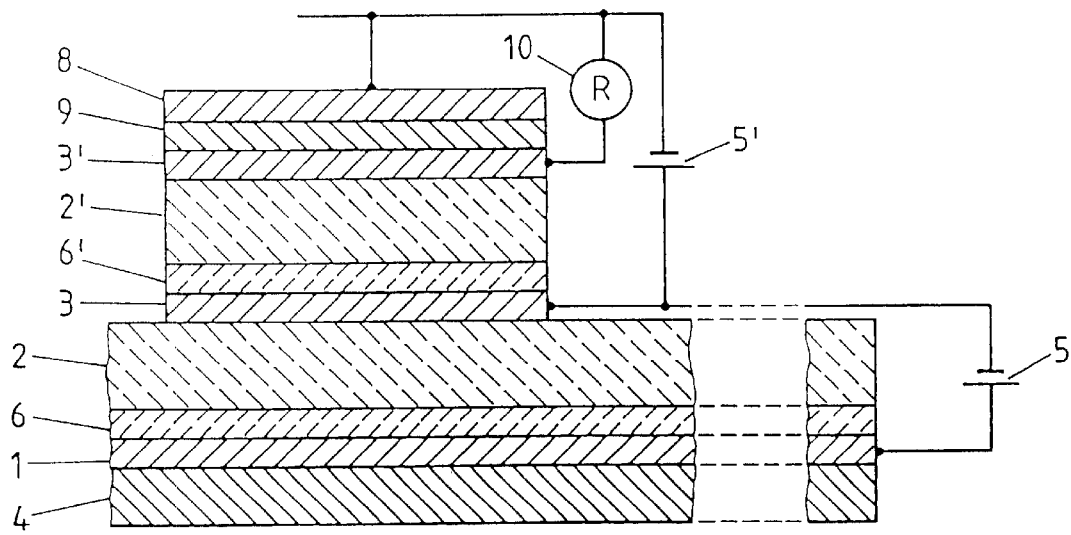
FIG. 7 shows schematically a partial section of a second memory device according to the invention comprising an array of memory cells constituted as magnetic elements and FIG. 8 shows schematically a section of a write head according to the invention constituted as a magnetic element.

A non-volatile memory cell is shown in FIG. 7. The structure is similar to that of the above-described memory cell. However, between the free layer 3 and the spacer layer 9 a further magnetic element is inserted, i.e. a further insulating layer 6', a further coupling layer 2' and a further free layer 3', the latter carrying the information whereas free layer 3 assumes the part of pinning layer. Also, the controllable voltage source 5 lies between the pinned layer 1 and the free layer 3, whereas a further controllable voltage source 5' is connected in between the free layer 3 and the connecting layer 8, pinned layer 1, free layer 3 and connecting layer 8 serving at the same time as electrodes. The magnetic exchange field $H'_{ex}{}^D(0)$ to which the further free layer 3' is exposed to at zero voltage from the free layer 3 is smaller than the coercive field $H'_c$ of the further free layer 3'. In operation the voltage of the further voltage source 5' is fixed at a value where the magnetic exchange field $H'_{ex}{}^D$ essentially assumes the extremum closest to d=0 where $|H_{ex}{}^D(d)|>H_c$. That is, the further free layer 3' always assumes a fixed—either constantly parallel or constantly antiparallel—magnetic orientation with respect to that of the free layer 3. E. g., with magnetic coupling as illustrated in FIGS. 4, 5 the magnetic orientations of the further free layer 3' and the free layer 3 will always be antiparallel. As the magnetic orientation of the free layer 3 can be controlled by the voltage source 5 in the manner described above the orientation of the further free layer 3' is implicitly controlled by the latter. If the further voltage source 5' is switched off the state of the further free layer 3' does not change while the magnetic coupling between the free layer 3 and the further free layer 3' ceases to be effective as the magnetic exchange field $H'_{ex}{}^D$ drops below the coercive field $H'_c$ of the latter. Consequently, even if subsequent switching off of the voltage source 5 causes the free layer 3 to flip this does not effect the further free layer 3' which retains its previous magnetic orientation.

Figure 8:
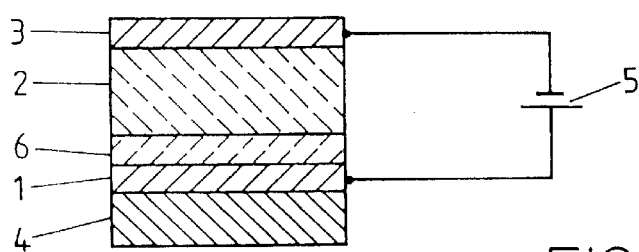

FIG. 8 shows a write head of the general structure of the magnetic element of FIG. 1 for writing to a magnetic storage disk where, again controlled by a voltage applied by voltage source 5, the magnetic orientations of the pinned layer 1 and the free layer 3 are either parallel or antiparallel. In the first case a strong magnetic field is created by the superposition of the parallel magnetic fields of the two layers whereas in the latter case the total field created by the superposition of antiparallel magnetic fields is weak.

It should be noted that in some cases, in particular where the lateral dimensions of the magnetic element are small, the stray field of the pinned layer 1 which is superposed on the magnetic exchange field can be of the same order of magnitude as the coercive field of the free layer 3 and consequently needs to be taken into account. In extended thin films with in-plane magnetization, however, the stray field is usually negligible.

What is claimed is:

1. A magnetic element comprising:
   a first layer switchable between a first magnetic orientation and a second magnetic orientation;
   a second layer of fixed magnetic orientation, the second layer formed of ferromagnetic or ferrimagnetic material;
   a third layer arranged between the first layer and the second layer, the properties of the third layer with respect to magnetic coupling being switchable between at least two different states by the application of an electric field; and
   a pinning layer adjacent to the second layer on a side opposite the third layer, said second layer magnetically coupled to the pinning layer.

2. The magnetic element according to claim 1, wherein the second layer comprises a material selected from the group consisting of:
   at least one perovskite or related compound, in particular an ordered double perovskite $A_2B'B''O_6$ where A is an alkaline earth element, $B'$ is Fe or Cr and $B''$ is Mo, W or Re;
   a perovskite $R_{1-x}A_xMnO_3$ with $0 \leq x \leq 1$ where R is a rare earth element and A an alkaline earth element; and
   $Fe_4N$.

3. The magnetic element according to claim 1, characterized in that the first layer comprises of ferromagnetic or ferrimagnetic material.

4. A magnetic element according to claim 3, wherein the first layer comprises a material selected from the group consisting of:
   Fe, Co, Ni, Gd, Y, Th, $Fe_3O_4$;
   an ordered double perovskite $A_2B'B''O_6$ wherein A is an alkaline earth element, $B'$ is Fe or Cr and $B''$ is Mo, W or Re;
   a perovskite $R_{1-x}A_xMnO_3$ with $0 \leq x \leq 1$ wherein R is a rare earth element and A an alkaline earth element;
   $Fe_4N$.

5. The magnetic element according to claim 1, characterized in that the third layer comprises a Mott insulator material.

6. A magnetic element according to claim 5, characterized in that the third layer essentially comprises at least one perovskite or related compound like.

7. The magnetic element according to claim 1, characterized in that it further comprises a controllable voltage source is connected between two electrodes arranged on opposite sides of the third layer.

8. A magnetic memory device comprising:
   a first layer switchable between a first magnetic orientation and a second magnetic orientation;
   a second layer of fixed magnetic orientation;

a third layer arranged between the first layer and the second layer, the properties of the third layer with respect to magnetic coupling being switchable between at least two different states by the application of an electric field;

a second free layer on the side of the first layer opposite the third layer;

a second coupling layer arranged between the first layer and the second free layer;

a second controllable voltage source connected between two electrodes arranged on opposite sides of the second coupling layer; and wherein the coercive field ($H'_c$) of the second free layer is greater than the magnetic exchange field ($H'^D_{ex}(0)$) the second free layer is exposed to at zero voltage.

9. A magnetic memory device comprising:

a first free layer switchable between a first magnetic orientation and a second magnetic orientation;

a pinned layer of fixed magnetic orientation;

a first coupling layer arranged between the first free layer and the pinned layer, the properties of the first coupling layer with respect to magnetic coupling being switchable between at least two different states by the application of an electric field;

a second free layer on the side of the first free layer opposite the first coupling layer;

a second coupling layer arranged between the first free layer and the second free layer;

a connecting layer;

a spacer layer arranged between connecting layer and the second free layer;

a first controllable voltage source electrically connected between the pinned layer and the first free layer;

a second controllable voltage source connected between the first free layer and the connecting layer;

a resistance measuring circuit connected between the second free layer and the connecting layer; and wherein the coercive field ($H'_c$) of the second free layer is greater than the magnetic exchange field ($H'^D_{ex}(0)$) the second free layer is exposed to at zero voltage.

10. A magnetic memory device according to claim 9 further comprising:

a first insulating layer arranged between the pinned layer and the first coupling layer; and a second insulating layer arranged between the first free layer and the second coupling layer.

11. A magnetic memory device according to claim 9 further comprising:

a pinning layer adjacent to the pinned layer on a side opposite the first coupling layer, said pinned layer magnetically coupled to the pinning layer.

12. A magnetic element according to claim 1, characterized in that the third layer is switchable between a magnetically non-coupling state and at least one magnetically coupling state.

13. A magnetic element according to claim 1, characterized in that the third layer is switchable between at least a ferromagnetically coupling state and an antiferromagnetically coupling state.

* * * * *